United States Patent
Ahn et al.

(10) Patent No.: US 8,497,542 B2
(45) Date of Patent: Jul. 30, 2013

(54) ZRXHFYSN1-X-YO2 FILMS AS HIGH K GATE DIELECTRICS

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/008,726

(22) Filed: Jan. 18, 2011

(65) Prior Publication Data

US 2011/0121378 A1 May 26, 2011

Related U.S. Application Data

(62) Division of application No. 12/126,311, filed on May 23, 2008, now Pat. No. 7,875,912, which is a division of application No. 11/215,530, filed on Aug. 29, 2005, now Pat. No. 7,393,736.

(51) Int. Cl.
*H01L 27/108* (2006.01)
*H01L 29/76* (2006.01)
*H01L 29/94* (2006.01)
*H01L 31/119* (2006.01)

(52) U.S. Cl.
USPC ...... 257/310; 257/288; 257/760; 257/E21.17; 257/E21.126; 257/E21.127; 257/E21.278; 257/E21.293; 257/E21.632; 257/E21.645

(58) Field of Classification Search
USPC ............. 257/288, 310, 204, 296, 760, 491, 257/759, E21.17, E21.126, E21.127, E21.278, 257/E21.293, E21.632, E21.645
See application file for complete search history.

(56) References Cited

U.S. PATENT DOCUMENTS 5,912,797 A 6/1999 Schneemeyer et al.
6,200,893 B1 3/2001 Sneh
(Continued)

FOREIGN PATENT DOCUMENTS

| JP | 03028162 | 2/1991 |
|---|---|---|
| WO | WO-0231875 A2 | 4/2002 |
| WO | WO-0243115 A2 | 5/2002 |

OTHER PUBLICATIONS

Aarik, J., et al., "Phase transformations in hafnium dioxide thin films grown by atomic layer deposition at high temperatures", Applied Surface Science, 173(1-2), (Mar. 2001), 15-21.

(Continued)

*Primary Examiner* — David Nhu
(74) *Attorney, Agent, or Firm* — Schwegman, Lundberg & Woessner, P.A.

(57) ABSTRACT

The use of atomic layer deposition (ALD) to form a nanolaminate dielectric of zirconium oxide ($ZrO_2$), hafnium oxide ($HfO_2$) and tin oxide ($SnO_2$) acting as a single dielectric layer with a formula of $Zr_x Hf_y Sn_{1-x-y} O_2$, and a method of fabricating such a dielectric layer is described that produces a reliable structure with a high dielectric constant (high k). The dielectric structure is formed by depositing zirconium oxide by atomic layer deposition onto a substrate surface using precursor chemicals, followed by depositing hafnium oxide onto the substrate using precursor chemicals, followed by depositing tin oxide onto the substrate using precursor chemicals, and repeating to form the thin laminate structure. Such a dielectric may be used as a gate insulator, a capacitor dielectric, or as a tunnel insulator in non-volatile memories, because the high dielectric constant (high k) provides the functionality of a much thinner silicon dioxide film.

21 Claims, 5 Drawing Sheets

U.S. PATENT DOCUMENTS

| | | |
|---|---|---|
| 6,451,695 B2 | 9/2002 | Sneh |
| 6,495,436 B2 | 12/2002 | Ahn et al. |
| 6,500,499 B1 | 12/2002 | Senzaki et al. |
| 6,514,828 B2 | 2/2003 | Ahn et al. |
| 6,534,420 B2 | 3/2003 | Ahn et al. |
| 6,537,613 B1 | 3/2003 | Senzaki et al. |
| 6,608,378 B2 | 8/2003 | Ahn et al. |
| 6,661,058 B2 | 12/2003 | Ahn et al. |
| 6,673,701 B1 | 1/2004 | Marsh et al. |
| 6,730,163 B2 | 5/2004 | Vaartstra |
| 6,730,164 B2 | 5/2004 | Vaartstra et al. |
| 6,746,930 B2 | 6/2004 | Yang et al. |
| 6,767,795 B2 | 7/2004 | Ahn et al. |
| 6,784,049 B2 | 8/2004 | Vaartstra |
| 6,787,413 B2 | 9/2004 | Ahn |
| 6,794,284 B2 | 9/2004 | Vaartstra |
| 6,844,203 B2 | 1/2005 | Ahn et al. |
| 6,863,725 B2 | 3/2005 | Vaartstra et al. |
| 6,893,984 B2 | 5/2005 | Ahn et al. |
| 6,900,122 B2 | 5/2005 | Ahn et al. |
| 6,921,702 B2 | 7/2005 | Ahn et al. |
| 6,953,730 B2 | 10/2005 | Ahn et al. |
| 6,958,300 B2 | 10/2005 | Vaartstra et al. |
| 6,958,302 B2 | 10/2005 | Ahn et al. |
| 6,960,538 B2 | 11/2005 | Ahn et al. |
| 6,967,154 B2 | 11/2005 | Meng et al. |
| 6,967,159 B2 | 11/2005 | Vaartstra |
| 6,984,592 B2 | 1/2006 | Vaartstra |
| 6,995,081 B2 | 2/2006 | Vaartstra |
| 7,026,694 B2 | 4/2006 | Ahn et al. |
| 7,030,042 B2 | 4/2006 | Vaartstra et al. |
| 7,041,609 B2 | 5/2006 | Vaartstra |
| 7,045,205 B1 | 5/2006 | Sager |
| 7,077,902 B2 | 7/2006 | Vaartstra |
| 7,081,421 B2 | 7/2006 | Ahn et al. |
| 7,087,481 B2 | 8/2006 | Vaartstra et al. |
| 7,101,813 B2 | 9/2006 | Ahn et al. |
| 7,112,485 B2 | 9/2006 | Vaartstra |
| 7,115,166 B2 | 10/2006 | Vaartstra et al. |
| 7,115,528 B2 | 10/2006 | Vaartstra et al. |
| 7,122,464 B2 | 10/2006 | Vaartstra |
| 7,125,815 B2 | 10/2006 | Vaartstra |
| 7,169,673 B2 | 1/2007 | Ahn et al. |
| 7,196,007 B2 | 3/2007 | Vaartstra |
| 7,205,218 B2 * | 4/2007 | Ahn et al. ............... 438/591 |
| 7,235,501 B2 | 6/2007 | Ahn et al. |
| 7,250,367 B2 | 7/2007 | Vaartstra et al. |
| 7,253,122 B2 | 8/2007 | Vaartstra |
| 7,271,077 B2 | 9/2007 | Vaartstra et al. |
| 7,294,556 B2 | 11/2007 | Vaartstra |
| 7,300,870 B2 | 11/2007 | Vaartstra |
| 7,323,423 B2 | 1/2008 | Brask et al. |
| 7,332,442 B2 | 2/2008 | Vaartstra et al. |
| 7,365,027 B2 | 4/2008 | Ahn et al. |
| 7,368,402 B2 | 5/2008 | Vaartstra |
| 7,374,617 B2 | 5/2008 | Vaartstra |
| 7,393,736 B2 * | 7/2008 | Ahn et al. ............... 438/197 |
| 7,402,876 B2 | 7/2008 | Ahn et al. |
| 7,410,917 B2 | 8/2008 | Ahn et al. |
| 7,410,918 B2 | 8/2008 | Vaartstra |
| 7,531,869 B2 | 5/2009 | Ahn et al. |
| 7,611,959 B2 | 11/2009 | Ahn et al. |
| 7,875,912 B2 * | 1/2011 | Ahn et al. ............... 257/288 |
| 2002/0024080 A1 | 2/2002 | Derderian et al. |
| 2002/0024108 A1 | 2/2002 | Lucovsky et al. |
| 2002/0025628 A1 | 2/2002 | Derderian et al. |
| 2002/0046705 A1 | 4/2002 | Sandhu et al. |
| 2002/0192974 A1 | 12/2002 | Ahn et al. |
| 2002/0192975 A1 | 12/2002 | Ahn |
| 2003/0043637 A1 | 3/2003 | Forbes et al. |
| 2003/0045078 A1 | 3/2003 | Ahn et al. |
| 2003/0045082 A1 | 3/2003 | Eldridge et al. |
| 2003/0048666 A1 | 3/2003 | Eldridge et al. |
| 2003/0175411 A1 | 9/2003 | Kodas et al. |
| 2003/0176065 A1 | 9/2003 | Vaartstra |
| 2003/0200917 A1 | 10/2003 | Vaartstra |
| 2003/0207032 A1 | 11/2003 | Ahn et al. |
| 2003/0207540 A1 | 11/2003 | Ahn et al. |
| 2003/0207593 A1 | 11/2003 | Derderian et al. |
| 2003/0227033 A1 | 12/2003 | Ahn et al. |
| 2003/0228747 A1 | 12/2003 | Ahn et al. |
| 2004/0040494 A1 | 3/2004 | Vaartstra et al. |
| 2004/0040501 A1 | 3/2004 | Vaartstra |
| 2004/0043151 A1 | 3/2004 | Vaartstra |
| 2004/0043541 A1 | 3/2004 | Ahn et al. |
| 2004/0043569 A1 | 3/2004 | Ahn et al. |
| 2004/0043600 A1 | 3/2004 | Vaartstra |
| 2004/0043604 A1 | 3/2004 | Vaartstra |
| 2004/0043625 A1 | 3/2004 | Vaartstra et al. |
| 2004/0043630 A1 | 3/2004 | Vaartstra et al. |
| 2004/0043632 A1 | 3/2004 | Vaartstra |
| 2004/0043633 A1 | 3/2004 | Vaartstra |
| 2004/0043634 A1 | 3/2004 | Vaartstra |
| 2004/0043635 A1 | 3/2004 | Vaartstra |
| 2004/0043636 A1 | 3/2004 | Vaartstra et al. |
| 2004/0065255 A1 | 4/2004 | Yang et al. |
| 2004/0094801 A1 | 5/2004 | Liang et al. |
| 2004/0110391 A1 | 6/2004 | Ahn et al. |
| 2004/0126954 A1 | 7/2004 | Vaartstra et al. |
| 2004/0144980 A1 | 7/2004 | Ahn et al. |
| 2004/0152254 A1 | 8/2004 | Vaartstra et al. |
| 2004/0164357 A1 | 8/2004 | Ahn et al. |
| 2004/0175882 A1 | 9/2004 | Ahn et al. |
| 2004/0183108 A1 | 9/2004 | Ahn |
| 2004/0185654 A1 | 9/2004 | Ahn |
| 2004/0187968 A1 | 9/2004 | Vaartstra |
| 2004/0197946 A1 | 10/2004 | Vaartstra et al. |
| 2004/0214399 A1 | 10/2004 | Ahn et al. |
| 2004/0219746 A1 | 11/2004 | Vaartstra et al. |
| 2004/0222476 A1 | 11/2004 | Ahn et al. |
| 2004/0262700 A1 | 12/2004 | Ahn et al. |
| 2005/0009266 A1 | 1/2005 | Vaartstra |
| 2005/0009368 A1 | 1/2005 | Vaartstra |
| 2005/0009370 A1 | 1/2005 | Ahn |
| 2005/0019978 A1 | 1/2005 | Vaartstra et al. |
| 2005/0020017 A1 | 1/2005 | Ahn et al. |
| 2005/0023594 A1 | 2/2005 | Ahn et al. |
| 2005/0023624 A1 | 2/2005 | Ahn et al. |
| 2005/0023625 A1 | 2/2005 | Ahn et al. |
| 2005/0023626 A1 | 2/2005 | Ahn et al. |
| 2005/0026349 A1 | 2/2005 | Forbes et al. |
| 2005/0028733 A1 | 2/2005 | Vaartstra |
| 2005/0029547 A1 | 2/2005 | Ahn et al. |
| 2005/0029604 A1 | 2/2005 | Ahn et al. |
| 2005/0029605 A1 | 2/2005 | Ahn et al. |
| 2005/0032292 A1 | 2/2005 | Ahn et al. |
| 2005/0032360 A1 | 2/2005 | Vaartstra |
| 2005/0037563 A1 | 2/2005 | Ahn |
| 2005/0054165 A1 | 3/2005 | Ahn et al. |
| 2005/0077519 A1 | 4/2005 | Ahn et al. |
| 2005/0124171 A1 | 6/2005 | Vaartstra |
| 2005/0124175 A1 | 6/2005 | Ahn et al. |
| 2005/0136689 A9 | 6/2005 | Vaartstra |
| 2005/0158973 A1 | 7/2005 | Ahn et al. |
| 2005/0160981 A9 | 7/2005 | Vaartstra et al. |
| 2005/0164521 A1 | 7/2005 | Ahn et al. |
| 2005/0215015 A1 | 9/2005 | Ahn et al. |
| 2005/0218462 A1 | 10/2005 | Ahn et al. |
| 2005/0221006 A1 | 10/2005 | Vaartstra |
| 2005/0227442 A1 | 10/2005 | Ahn et al. |
| 2005/0287804 A1 | 12/2005 | Vaartstra |
| 2005/0287819 A1 | 12/2005 | Vaartstra et al. |
| 2006/0024975 A1 | 2/2006 | Ahn et al. |
| 2006/0043504 A1 | 3/2006 | Ahn et al. |
| 2006/0046505 A1 | 3/2006 | Ahn et al. |
| 2006/0046521 A1 | 3/2006 | Vaartstra et al. |
| 2006/0048711 A1 | 3/2006 | Vaartstra |
| 2006/0148180 A1 | 7/2006 | Ahn et al. |
| 2006/0172485 A1 | 8/2006 | Vaartstra |
| 2006/0176645 A1 | 8/2006 | Ahn et al. |
| 2006/0177975 A1 | 8/2006 | Ahn et al. |
| 2006/0223337 A1 | 10/2006 | Ahn et al. |
| 2006/0231017 A1 | 10/2006 | Vaartstra |
| 2006/0244082 A1 | 11/2006 | Ahn et al. |
| 2006/0244100 A1 | 11/2006 | Ahn et al. |
| 2006/0252244 A1 | 11/2006 | Vaartstra et al. |
| 2006/0252279 A1 | 11/2006 | Vaartstra |

| | | |
|---|---|---|
| 2006/0258175 A1 | 11/2006 | Vaartstra et al. |
| 2006/0261389 A1 | 11/2006 | Vaartstra |
| 2006/0270147 A1 | 11/2006 | Ahn et al. |
| 2006/0281330 A1 | 12/2006 | Ahn et al. |
| 2006/0292788 A1 | 12/2006 | Vaartstra |
| 2007/0006798 A1 | 1/2007 | Vaartstra et al. |
| 2007/0099366 A1 | 5/2007 | Ahn et al. |
| 2007/0144438 A1 | 6/2007 | Vaartstra |
| 2007/0155190 A1 | 7/2007 | Vaartstra et al. |
| 2007/0161260 A1 | 7/2007 | Vaartstra |
| 2007/0166999 A1 | 7/2007 | Vaartstra |
| 2007/0295273 A1 | 12/2007 | Vaartstra |
| 2008/0064210 A1 | 3/2008 | Vaartstra |
| 2008/0087890 A1 | 4/2008 | Ahn et al. |
| 2008/0102629 A1 | 5/2008 | Vaartstra |
| 2008/0121962 A1 | 5/2008 | Forbes et al. |
| 2008/0124907 A1 | 5/2008 | Forbes et al. |
| 2008/0124908 A1 | 5/2008 | Forbes et al. |
| 2008/0191350 A1 | 8/2008 | Ahn et al. |
| 2008/0191351 A1 | 8/2008 | Ahn et al. |
| 2008/0193791 A1 | 8/2008 | Ahn et al. |
| 2008/0194094 A1 | 8/2008 | Ahn et al. |
| 2008/0224240 A1 | 9/2008 | Ahn et al. |
| 2008/0274625 A1 | 11/2008 | Ahn et al. |
| 2010/0044771 A1 | 2/2010 | Ahn et al. |

OTHER PUBLICATIONS

Aarik, Jaan, "Influence of substrate temperature on atomic layer growth and properties of HfO/sub 2/ thin films", Thin Solid Films, 340(1-2), (1999), 110-116.

Aarik, Jaan, et al., "Texture development in nanocrystalline hafnium dioxide thin films grown by atomic layer deposition", Journal of Crystal Growth, 220(1-2), (Nov. 15, 2000), 105-113.

Ahn, Kie Y, "ALD of Amorphous Lanthanide Doped TIOX Films", U.S. Appl. No. 11/092,072, filed Mar. 29, 2005, 04-1321.

Ahn, Kie Y, "Atomic Layer Deposited Hafnium Tantalum Oxide Dielectrics", U.S. Appl. No. 11/029,757, filed Jan. 5, 2005.

Ahn, Kie Y, "Atomic Layer Deposited Lanthanum Aluminum Oxide Dielectric Layer", U.S. Appl. No. 10/930,167, filed Aug. 31, 2004, 04-0686.

Ahn, Kie Y, "Atomic Layer Deposited Lanthanum Hafnium Oxide Dielectrics", U.S. Appl. No. 11/010,529, filed Dec. 13, 2004.

Ahn, Kie Y, "Atomic Layer Deposited Titanium Aluminum Oxide Films", U.S. Appl. No. 10/931,533, filed Aug. 31, 2004, client ref No. 04-0579.

Ahn, Kie Y, "Atomic Layer Deposited Titanium Silicon Oxide Films", U.S. Appl. No. 11/093,104, filed Mar. 29, 2005, 05-0019.

Ahn, Kie Y, "Atomic Layer Deposited Zirconium Silicon Oxide Films", U.S. Appl. No. 11/117,121, filed Apr. 28, 2005, 05-0061.

Ahn, Kie Y, "Atomic Layer Deposition of a Ruthenium Layer to a Lanthanide Oxide Dielectric Layer", U.S. Appl. No. 11/117,125, filed Apr. 28, 2005, 05-0116.

Ahn, Kie Y, "Atomic Layer Deposition of CEO2/AL2O3 Films As Gate Dielectrics", U.S. Appl. No. 11/055,380, filed Feb. 10, 2005, 04-1094.

Ahn, Kie Y, "Atomic Layer Deposition of Dy-Doped HFO2 Films As Gate Dielectrics", U.S. Appl. No. 11/053,577, filed Feb. 8, 2005, 04-1179.

Ahn, Kie Y., et al., "Atomic Layer Deposition of Zirconium-Doped Tantalum Oxide Films", U.S. Appl. No. 10/909,959, filed Aug. 2, 2004.

Ahn, Kie Y, "Hafnium Titanium Oxide Films", U.S. Appl. No. 11/140,643, filed May 27, 2005, 05-0172.

Ahn, Kie Y, "Hybrid ALD-CVD of PrXOY/ZrO2 Films As Gate Dielectrics", U.S. Appl. No. 11/010,766, filed Dec. 13, 2004, 04-0997.

Ahn, Kie Y, "Iridium / Zirconium Oxide Structure", U.S. Appl. No. 11/152,759, filed Jun. 14, 2005, 05-0201.

Ahn, Kie Y, "Ruthenium Gate for a Lanthanide Oxide Dielectric Layer", U.S. Appl. No. 10/926,812, filed Aug. 26, 2004, client ref No. 04-0538.

Ahn, Kie Y., et al., "Semiconductor Constructions Comprising Cerium Oxide and Titanium Oxide; and Methods of Forming Semiconductor Constructions", U.S. Appl. No. 10/881,874, filed Jun. 29, 2004 (Client Ref. No. 04-0207).

Conley, J. F, "Atomic Layer Deposition of Hafnium Oxide Using Anhydrous Hafnium Nitrate", Electrochemical and Solid-State Letters, 5(5), (May, 2002), C57-C59.

Endo, Kazuhiko, "Metal Organic Atomic Layer Deposition of High-k Gate Dielectrics Using Plasma Oxidation", Japanese Journal of Applied Physics, 42, (2003), L685-L687.

Hubbard, K. J., et al., "Thermodynamic stability of binary oxides in contact with silicon", Journal of Materials Research, 11(11), (Nov. 1996), 2757-2776.

Ishii, Hiroyuki, "Growth and electrical properties of atomic-layer deposited ZrO2/Si-nitride stack gate dielectrics", Journal of Applied Physics, 95(2), (Jan. 15, 2004), 536-542.

Jonsson, A. K., "Dielectric Permittivity and Intercalation Parameters of Li Ion Intercalated Atomic Layer Deposited ZrO2", Journal of the Electrochemical Society, vol. 151, No. 3, (2004), F54-F58.

Kingon, Angus I, et al., "review article Alternative dielectrics to silicon dioxide for memory and logic devices", Nature, 406, (Aug. 31, 2000), 1032-1038.

Kukli, Kaupo, "Comparison of hafnium oxide films grown by atomic layer deposition from iodide and chloride precursors", Thin Solid Films, 416, (2002), 72-79.

Ritala, et al., "Atomic layer epitaxy-a valuable tool for nanotechnology?", Nanotechnology 10, (1999), 19-24.

Schlom, Darrell G., et al., "A Thermodynamic Approach to Selecting Alternative Gate Dielectrics", MRS Bulletin, (Mar. 2002), 198-204.

Smith, Ryan C., "Chemical Vapour Deposition of the Oxides of Titanium, Zirconium and Hafnium for Use as High-k Materials in Microelectronic Devices. A Carbon-free Precursor for the Synthesis of Hafnium Dioxide", Advanced Materials for Optics and Electronics, 10(35), (2000), 105-114.

Smith, Ryan C., et al., "Combinatorial Chemical Vapor Deposition of Metal Dioxides Using Anhydrous Metal Nitrates", Chem. Mater. 14, (2002), 474-476.

Smith, Ryan C., et al., "Combinatorial Chemical Vapor Deposition. Achieving Compositional Spreads of Titanium, Tin, and Hafnium Oxides by Balancing Reactor Fluid Dynamics and Deposition Kinetics", Chem. Mater. 15, (2003), 292-298.

Sneh, Ofer, "Thin film atomic layer deposition equipment for semiconductor processing", Thin Solid Films, 402(1-2), Preparation and Characterization, Elsevier Sequoia, NL, vol. 402, No. 1-2, (2002), 248-261.

Viirola, H, et al., "Controlled growth of tin dioxide thin films by atomic layer epitaxy", Thin Solid Films, 249(2), (Sep. 1994), 144-149.

Xia, Bin, et al., "Balancing reactor fluid dynamics and deposition kinetics to achieve compositional variation in combinatorial chemical vapor deposition", Applied Surface Science 223, (2004), 14-19.

Xia, Bin, et al., "Combinatorial CVD of Zirconium, Hafnium, and Tin Dioxide Mixtures for Applications as High-k Materials", Chemical Vapor Deposition 10(4), (2004), 195-200.

Youm, Minsoo, "Metal oxide semiconductor field effect transistor characteristics with iridium gate electrode on atomic layer deposited ZrO2 high-k dielectrics", Jpn. J. Appl. Phys., vol. 42, (Aug. 2003), 5010-5013.

\* cited by examiner

# ZR$_X$HF$_Y$SN$_{1-X-Y}$O$_2$ FILMS AS HIGH K GATE DIELECTRICS

RELATED APPLICATION(S)

This application is a divisional of U.S. application Ser. No. 12/126,311, filed May 23, 2008, now issued as U.S. Pat. No. 7,875,912, which is a divisional of U.S. application Ser. No. 11/215,530 filed Aug. 29, 2005, now issued as U.S. Pat. No. 7,393,736, both of which are incorporated herein by reference in their entirety.

TECHNICAL FIELD

This application relates generally to semiconductor devices and device fabrication, and more particularly to dielectric layers and their method of fabrication.

BACKGROUND

The semiconductor device industry has a market driven need to continue to reduce the size of semiconductor devices such as transistors in order to obtain lower power consumption and higher performance. To reduce transistor size, the thickness of the silicon dioxide, $SiO_2$, gate dielectric is reduced in proportion to the shrinkage of the gate length. For example, a metal-oxide-semiconductor field effect transistor (MOSFET) might use a 1.5 nm thick $SiO_2$ gate dielectric for a gate length of 70 nm. An industry goal is to fabricate smaller, more reliable integrated circuits (ICs) for use in products such as processor chips, mobile telephones, and memory devices such as dynamic random access memories (DRAMs).

The semiconductor industry relies on the ability to reduce the dimensions of its basic devices (known as scaling), for example the silicon based MOSFET. This device scaling includes scaling the gate dielectric, which has primarily been fabricated using silicon dioxide. A thermally grown amorphous $SiO_2$ layer provides an electrically and thermodynamically stable material, where the interface of the $SiO_2$ layer with underlying silicon provides a high quality interface as well as superior electrical isolation properties. However, increased scaling and other requirements in microelectronic devices have created the need to use other dielectric materials as gate dielectrics, in particular dielectrics with higher dielectric constants to replace the use of various combinations of $SiO_2$, $Si_3N_4$ and SiON. For these higher dielectric constant materials to be practical they must have the properties of high permittivity, thermal stability, high film and surface quality and smoothness, low hysteresis characteristics, low leakage current density, and long term reliability. High k films may be metal oxide unary materials such as $Al_2O_3$, $CeO_2$, $HfO_2$ and $ZrO_2$, which have a single component, or binary systems such as $(Y_2O_3)_X(ZrO_2)_{1-X}$, $LaAlO_3$, and $(HfO_2)(Al_2O_3)$, which have two components, and so on. High k films may be single layers, or may be formed of multiple layers of different materials that act as a composite material. The high k films are preferably amorphous to maintain surface smoothness and prevent electric field concentration at sharp projections, and to minimize leakage current along crystal boundaries. There is a need in the industry to find a method of forming high k films that possess the above noted features and are practical for use in manufacturing integrated circuits (ICs).

SUMMARY

The above mentioned problems are addressed by the present invention and will be understood by reading and studying the following specification.

An embodiment of a method for forming an electronic device includes forming a dielectric layer by using an atomic layer deposition (ALD) technique to form a nanolaminate layered dielectric having layers of zirconium oxide ($ZrO_2$), hafnium oxide ($HfO_2$) and tin oxide ($SnO_2$). The dielectric structure may act as a single dielectric layer, and is formed by depositing the various metal oxides by atomic layer deposition onto a substrate surface using precursor chemicals containing zirconium compounds, followed by a purge and deposition of an oxidizing material such as ozone, hydrogen peroxide or water vapor to form a thin (often a single molecular layer) film of $ZrO_2$. Formation continues with ALD depositing hafnium oxide using precursor chemicals containing hafnium compounds, followed by a purge and deposition of an oxidizing material such as ozone or water vapor to form a thin film of $HfO_2$, followed by ALD deposition of a tin oxide layer using precursor chemicals containing tin compounds, followed by a purge and deposition of an oxidizing material such as ozone or water vapor to form a thin film of $SnO_2$. The above three film formation steps may be repeated as often as necessary to form a thin laminate dielectric structure of the required thickness. The order of the three film forming steps is not limited to the disclosed order, but may be varied to obtain any desired combination, and the final film may act as a single alloyed layer rather than as three separate films. A dielectric layer formed of zirconium oxide, hafnium oxide and tin oxide may be beneficially used in electronic devices because the high dielectric constant (high k) of the film provides the functionality of a much thinner silicon dioxide film without the reliability loss consequent to using such thin oxide films.

The addition of zirconium oxide to produce a controlled compositional spread of hafnium and tin oxides provides a more stable silicon insulator interface, which has a larger bandgap and thus better insulation properties, and provides the ability to adjust the dielectric constant k, and the film microstructure to the particular electronic device application.

The use of tin oxide reduces the tendency of metal oxides to form as a crystalline or polycrystalline material if the deposition temperature is too high, and for amorphous metal oxide films to re-crystallize during the thermal cycling typically found in modern semiconductor fabrication processes. In particular, the metal oxide films need to remain substantially amorphous after the gate electrode deposition process, spacer oxide deposition and etching, source drain implantation and anneal, and gate electrode re-oxidation processes, which may include temperatures of from 900° C. to 1000° C. in typical complementary metal-oxide-semiconductor (CMOS) processes.

Embodiments include structures for capacitors, transistors, memory devices, and electronic systems with dielectric layers containing an atomic layer deposited zirconium oxide, hafnium oxide and tin oxide layers, having various individual layer thickness, layer order and number of layers of each individual material, and methods for forming such structures. These and other aspects, embodiments, advantages, and features will become apparent from the following description and the referenced drawings.

DETAILED DESCRIPTION

Figure 1:
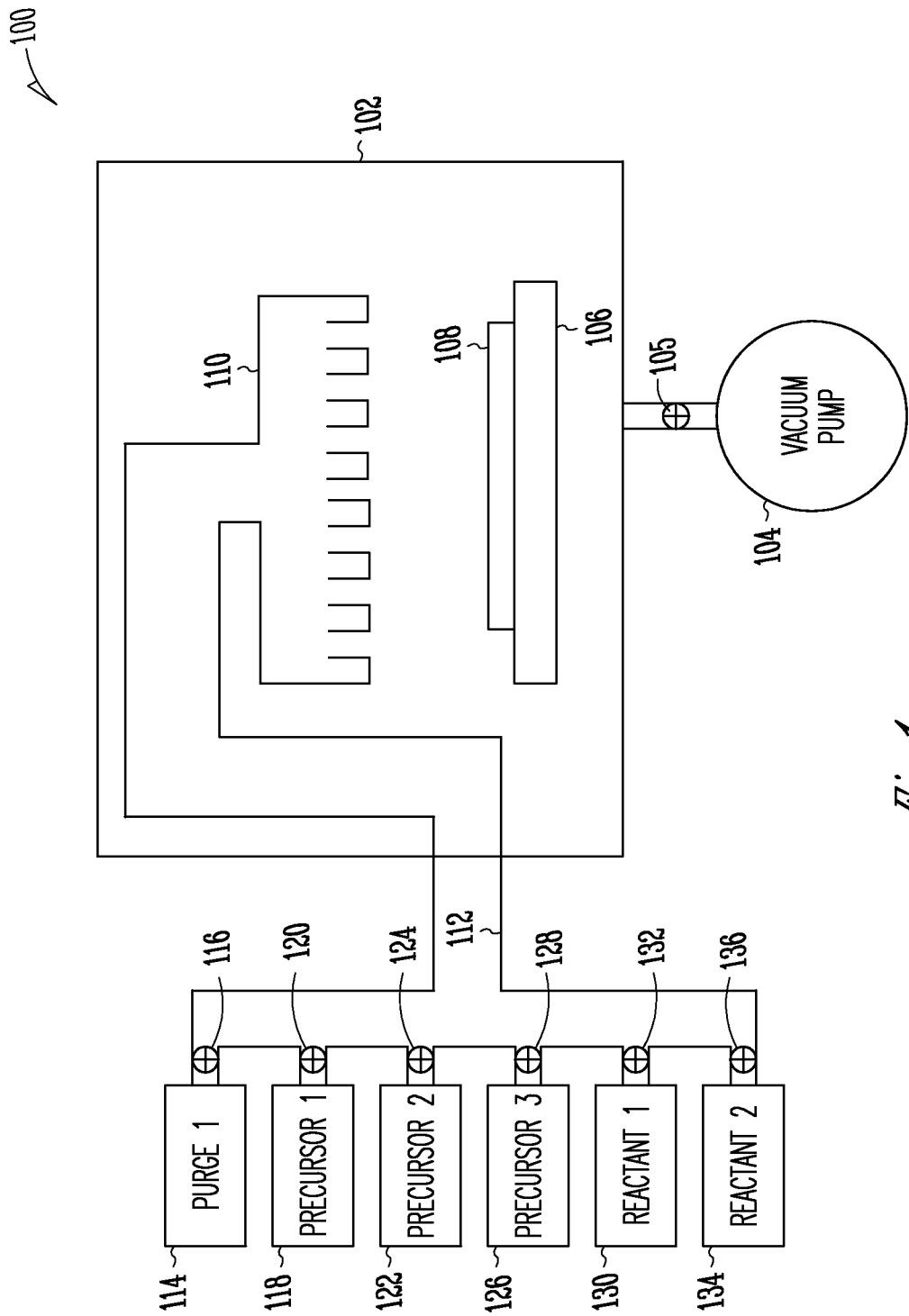
FIG. 1 depicts an atomic layer deposition system for fabricating a single dielectric layer formed as a nanolaminate layered sequence of zirconium oxide ($ZrO_2$), hafnium oxide ($HfO_2$), and tin oxide ($SnO_2$) layers, according to various embodiments of the present invention.

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments are not necessarily mutually exclusive, as some embodiments can be combined with one or more other embodiments to form new embodiments.

The terms "wafer" and "substrate" as used in the following description may include any structure having an exposed surface with which to form an integrated circuit (IC) structure. The term "substrate" is understood to include semiconductor wafers. The term "substrate" is also used to refer to semiconductor structures during processing, and may include other layers that have been fabricated thereupon. Both "wafer" and "substrate" include doped and undoped semiconductors, epitaxial semiconductor layers supported by a base semiconductor or insulator, as well as other semiconductor structures well known to one skilled in the art. The term "conductor" is understood to generally include n-type and p-type semiconductors and the term "insulator" or "dielectric" is defined to include any material that is less electrically conductive than the materials referred to as conductors or as semiconductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

A gate dielectric in a transistor has both a physical gate dielectric thickness and an equivalent oxide thickness (EOT or $t_{eq}$). The equivalent oxide thickness (EOT) quantifies the electrical properties, such as capacitance, of the high k gate dielectric in terms of a representative physical thickness of a silicon dioxide gate dielectric. The term $t_{eq}$ is defined as the thickness of a theoretical $SiO_2$ layer that would be required to have the same capacitance density as a given dielectric, ignoring leakage current and reliability considerations.

A $SiO_2$ layer of thickness, t, deposited on a Si surface as a gate dielectric will have a $t_{eq}$ larger than its thickness, t. This $t_{eq}$ results from the capacitance in the surface channel on which the $SiO_2$ is deposited due to the formation of a depletion/inversion region. This depletion/inversion region can result in $t_{eq}$ being from 3 to 6 Angstroms (Å) larger than the physical $SiO_2$ thickness, t. Thus, with the semiconductor industry moving to scale the gate dielectric equivalent oxide thickness to under 10 Å, the physical thickness requirement for a $SiO_2$ layer used for a gate dielectric would need to be approximately 4 to 7 Å.

Additional requirements for a $SiO_2$ gate dielectric layer would depend on the properties of the gate electrode used in conjunction with the $SiO_2$ gate dielectric. Using a conventional polysilicon gate would result in an additional increase in $t_{eq}$ for the $SiO_2$ layer. This additional thickness could be eliminated by using a metal gate electrode, though metal gates are not currently used in typical complementary metal-oxide-semiconductor (CMOS) field effect transistor technology. Thus, future devices may require a physical $SiO_2$ gate dielectric layer of about 5 Å or less. Such a small thickness requirement for a $SiO_2$ oxide layer creates additional problems such as current leakage across the thin dielectric.

Silicon dioxide is used as a gate dielectric, in part, due to its electrical isolation properties in a $SiO_2$—Si based structure. This electrical isolation is due to the relatively large band gap of $SiO_2$ (8.9 eV) making it a good electrical insulator. Significant reductions in its band gap would eliminate $SiO_2$ as a material for a gate dielectric. As the thickness of a $SiO_2$ layer decreases, the number of atomic layers, or monolayers of the material in the thickness decreases. At a certain thickness, the number of monolayers will be sufficiently small that the $SiO_2$ layer will not have as complete an arrangement of atoms as found in a thicker, or bulk, layer. As a result of incomplete formation relative to a bulk structure, a thin $SiO_2$ layer of only one or two monolayers will not form a full band gap. The lack of a full band gap in a $SiO_2$ gate dielectric may cause an effective short between an underlying conductive silicon channel and an overlying polysilicon gate. This undesirable property sets a limit on the minimum physical thickness to which a $SiO_2$ layer can be scaled. The minimum thickness due to this monolayer effect is thought to be about 7-8 Å. Therefore, for future devices to have a $t_{eq}$ less than about 10 Å, other dielectrics than $SiO_2$ need to be considered for use as a gate dielectric.

For a typical dielectric layer used as a gate dielectric, the capacitance is determined as in a parallel plate capacitance: $C=k\epsilon_0 A/t$, where k is the dielectric constant, $\epsilon_0$ is the permittivity of free space, A is the area of the capacitor, and t is the thickness of the dielectric. The thickness, t, of a material is related to its $t_{eq}$ for a given capacitance, with $SiO_2$ having a dielectric constant $k_{ox}=3.9$, as $$t=(k/k_{ox})t_{eq}=(k/3.9)t_{eq}.$$

Thus, materials with a dielectric constant greater than that of $SiO_2$, (typically about 3.9), will have a physical thickness that can be considerably larger than a desired $t_{eq}$ while providing the desired equivalent oxide thickness. For example, an alternative dielectric material with a dielectric constant of 10, such as $Al_2O_3$, could have a thickness of about 25.6 Å to provide a $t_{eq}$ of 10 Å, not including any depletion or inversion layer effects. Thus, a reduced equivalent oxide thickness for transistors can be realized by using dielectric materials with higher dielectric constants than $SiO_2$.

The thinner equivalent oxide thickness (EOT) required for lower transistor operating voltages and smaller transistor dimensions may be realized by a significant number of materials, but additional fabricating requirements make determining a suitable replacement for $SiO_2$ difficult. The current view for the future of the microelectronics industry still predicts silicon based devices. This requires that the gate dielectric employed be grown on a silicon substrate or silicon layer, which places significant constraints on the substitute dielectric material. During the formation of the dielectric on the silicon layer, there exists the possibility that a small layer of $SiO_2$ could be formed in addition to the desired dielectric. The result would effectively be a dielectric layer consisting of two sub-layers in parallel with each other and the silicon layer on which the dielectric is formed. In such a case, the resulting capacitance would be that of two dielectrics in series. As a result, the $t_{eq}$ of the dielectric layer would be the sum of the $SiO_2$ thickness and a multiplicative factor of the thickness, t, of the dielectric being formed, written as $$t_{eq} = t_{SiO2} + (k_{ox}/k)t.$$

Thus, if a $SiO_2$ layer is formed in the process, the $t_{eq}$ is again limited by a $SiO_2$ layer. In the event that a barrier layer is formed between the silicon layer and the desired dielectric in which the barrier layer prevents the formation of a $SiO_2$ layer, the $t_{eq}$ would be limited by the layer with the lowest dielectric constant. Thus a desirable feature of the new high k dielectric would be an oxygen barrier to prevent a layer of $SiO_2$ from forming on the silicon surface. However, whether a single dielectric layer with a high dielectric constant or a barrier layer with a higher dielectric constant than $SiO_2$ is employed, the layer directly in contact with, or interfacing with the silicon layer must provide a high quality interface to maintain high channel carrier mobility.

One of the advantages of using $SiO_2$ as a gate dielectric has been that the formation of the $SiO_2$ layer results in an amorphous gate dielectric. Having an amorphous structure for a gate dielectric provides reduced leakage current problems associated with grain boundaries in polycrystalline gate dielectrics, which may cause high leakage paths. Additionally, grain size and orientation changes throughout a polycrystalline gate dielectric can cause variations in the film's dielectric constant, along with uniformity and surface topography problems. Typically, materials having the advantage of a high dielectric constant relative to $SiO_2$ also have the disadvantage of existing in a crystalline form, at least in a bulk configuration. The best candidates for replacing $SiO_2$ as a gate dielectric are those with high dielectric constants, which can be fabricated as a thin layer with an amorphous form that can remain amorphous during the thermal cycles typically found in semiconductor production after the growth of the gate dielectric, such as gate electrode growth, metal deposition, and annealing operations. Tin oxides, such as $SnO_2$, when alloyed with other oxides have been shown to raise the oxide crystallization temperature, and thus stabilize the long term interfacial characteristics of the amorphous dielectric at temperatures up to 1000° C.

Candidates to replace $SiO_2$ include materials with high k dielectric constants, a large energy gap ($E_g$), large energy barrier heights with the silicon substrate for both electrons and holes, and an amorphous nature that resists crystallization during the thermal cycling typically found in semiconductor manufacturing. High k materials may be defined as having a dielectric constant greater than about twice the dielectric constant of silicon dioxide. Generally, the band gap is inversely related to the dielectric constant for a high k material, which lessens some advantages of the high k material because of the potential leakage. High k dielectric candidates for replacing silicon oxide as the dielectric material in electronic components in integrated circuits include the lanthanide oxides such as $Gd_2O_3$, $Ce_2O_3$, $La_2O_3$, $Pr_2O_3$, $Nd_2O_3$, $Sm_2O_3$, $Dy_2O_3$, $Tb_2O_3$, $Er_2O_3$, $Eu_2O_3$, $Lu_2O_3$, $Tm_2O_3$, $Ho_2O_3$, $Pm_2O_3$, and $Yb_2O_3$. Other candidates include various lanthanide silicates, titanium oxide $TiO_2$ and zirconium oxide, $ZrO_2$. Such high dielectric constant layers provide a significantly thinner equivalent oxide thickness compared with a silicon oxide layer having the same physical thickness. Alternatively, such dielectric layers provide a significantly thicker physical thickness than a silicon oxide layer having the same equivalent oxide thickness. This increased physical thickness aids in reducing leakage current.

Another consideration for selecting the material and method for forming a dielectric film for use in electronic devices and systems concerns the roughness of a dielectric film on a substrate. Surface roughness of the dielectric film has a significant effect on the electrical properties of the gate oxide, and the resulting operating characteristics of the transistor. The leakage current through a physical 1.0 nm gate dielectric may increase by a factor of 10 for every 0.1 increase in the root-mean-square (RMS) roughness of the dielectric layer.

During a conventional sputtering deposition process, particles of the material to be deposited bombard the surface at a high energy. When a particle hits the surface, some particles adhere, and other particles cause damage. High energy impacts remove body region particles creating pits. The surface of such a deposited layer may have a rough contour due to the rough interface at the body region, and thus the electrical properties of a thin film may not be as good as the values in a bulk sample of the same material. Thus the method with which the thin film dielectric is deposited may have a substantial impact on the usefulness of the material in electronic devices.

Until now, no material has been found that meets all the requirements of a proper gate dielectric, such as chemical/structural stability in contact with silicon at high temperatures such as are found in semiconductor processing, a large bandgap and conduction band/valence band offsets to silicon, a high k value, and the ability to remain amorphous during fabrication thermal cycles. Hafnium oxide ($HfO_2$), a widely studied material, has a dielectric constant of about 20, a bandgap of around 5.6 eV, and conduction band/valence band offsets versus silicon of 2.0 eV/2.5 eV, but loses its amorphous nature at temperatures around 500° C., which is lower than the temperatures of a typical CMOS process of about 900° C. Moreover it is important to not exceed the thermal budget of a semiconductor structure. The loss of amorphous properties may result in leakage down the crystal boundaries. Another potential issue with hafnium oxide is that oxygen may diffuse through the hafnium oxide during subsequent furnace operations, and form a $SiO_2$ layer underneath the hafnium oxide at the silicon interface, resulting in reduced capacitive coupling between the gate electrode and the semiconductor.

In seeking to correct the above noted problems with high k metal oxides, it has been found that adding tin oxide to hafnium oxides results in improved ability to remain amorphous, with atomic percentages of tin above about 8 percent resulting in substantially amorphous films. However, tin oxide has a rather low dielectric constant of from 9-12, which will reduce the dielectric constant of a hafnium oxide film (from 17-21) depending upon the relative ratios of tin to hafnium. The addition of a high k material such as titanium oxide or zirconium oxide to the tin oxide and hafnium oxide mix will increase the dielectric constant, since titanium oxide has a dielectric constant of about 35, and zirconium oxide has a dielectric constant of about 22. It would appear clear to use titanium oxide since the dielectric constant is better, but the much larger bandgap of zirconium oxide (6.0 eV) as compared to titanium oxide results in improved electrical insulation properties, which may be significant in the present arrangement since the bandgap of tin oxide is quite low as a semiconductive material, and leakage levels in tin oxides may range from 0.01 to 5 amps/cm$^2$. Zirconium oxides also result in improved thermal stability and silicon interface properties since the atomic size of zirconium better matches the hafnium atoms than titanium atoms do. The resulting three-part film of tin, hafnium, and zirconium oxides can remain amorphous through the thermal cycles of semiconductor processing due to the controlled tin composition, and the dielectric constants are still around 20 due to the high values of the hafnium and zirconium oxides, both of which have dielectric constant values of from 20-22. The leakage across the dielectric film ranges between $10^{-7}$ A/cm$^2$ to $10\times10^{-9}$ A/cm$^2$, depending upon the level of tin oxide in the composition, which may thus form useful dielectric layers for semiconductor device gate insulators.

The use of an atomic layer deposition (ALD) $Zr_X Hf_Y Sn_Z O_2$ film, where X+Y+Z=1.0, may have a selectable dielectric constant ranging from 9 to 20.2 depending primarily upon the value of Z in the $Sn_Z$ portion of the general formula given above, and upon the deposition temperature. For example, a $Zr_{0.17} Hf_{0.15} Sn_{0.14} O_2$ film has been found to have a dielectric constant of about 20 when grown at 450° C., and a $Zr_{0.81} Hf_{0.12} Sn_{0.07} O_2$ film grown at 400° C. was also found to have a dielectric constant of around 20, and still maintain its amorphous nature.

A 20 nm thick layer of either of the above noted film compositions would have an equivalent oxide thickness (EOT) of about 1.0 nm, but being much thicker that the equivalent layer of silicon dioxide, would have much lower leakage currents. The use of ALD results in dielectric layers grown on silicon surfaces having improved surface smoothness of around 0.20 nm root mean square (RMS) value on a 20 nm thick layer, resulting in less electric field concentration at insulator corners and projections, and again lower leakage currents. Further, forming such a dielectric film using atomic layer deposition can provide for controlling transitions between different material layers. As a result of such control, ALD deposited dielectric films may have an engineered transition with a substrate surface, or may be formed of many thin layers of different dielectric materials to enable selection of the dielectric constant to a value that is between the values obtainable from pure dielectric compounds.

ALD, which may be known as atomic layer epitaxy (ALE), is a modification of chemical vapor deposition (CVD) and may also be called "alternatively pulsed-CVD." In ALD, gaseous precursors are introduced one at a time to the substrate surface mounted within a reaction chamber (or reactor). This introduction of the gaseous precursors takes the form of pulses of each gaseous precursor. In a pulse of a precursor gas, the precursor gas is made to flow into a specific area or region for a short period of time. Between the pulses, the reaction chamber is purged with a gas, which in many cases is an inert gas, and/or evacuated.

In the first reaction step of the ALD process, the first precursor saturates and is chemisorbed at the substrate surface during the first pulsing phase. Subsequent pulsing with a purging gas removes excess precursor from the reaction chamber, specifically the precursor that has not been chemisorbed.

The second pulsing phase introduces a second precursor to the substrate where the growth reaction of the desired film takes place, with a reaction thickness that depends upon the amount of chemisorbed first precursor. Subsequent to the film growth reaction, reaction byproducts and precursor excess are purged from the reaction chamber. With a precursor chemistry where the precursors adsorb and aggressively react with each other on the substrate, one ALD cycle can be performed in less than one second in a flow type reaction chamber. Typically, precursor pulse times range from about 0.5 sec to about 2 to 3 seconds.

In ALD processes, the saturation of all the reaction and purging phases makes the film growth self-limiting. This self-limiting growth results in large area uniformity and conformality, which has important applications for such cases as planar substrates, deep trenches, and in the processing of porous silicon and high surface area silica and alumina powders. ALD provides for controlling film thickness in a straightforward manner by controlling the number of growth cycles.

ALD was originally developed to manufacture luminescent and dielectric films needed in electroluminescent displays, such as doped zinc sulfide and alkaline earth metal sulfide films. ALD can also grow different epitaxial II-V and II-VI films, non-epitaxial crystalline or amorphous oxide and nitride films, and multilayer structures.

The precursors used in an ALD process may be gaseous, liquid or solid; however, liquid or solid precursors should be volatile with a vapor pressure high enough for effective mass transportation. In addition, solid and some liquid precursors may need to be heated inside the reaction chamber and introduced through heated tubes to the substrates. The necessary vapor pressure should be reached at a temperature below the substrate temperature to avoid the condensation of the precursors on the substrate. Due to the self-limiting growth mechanisms of ALD, relatively low vapor pressure solid precursors can be used, though evaporation rates may vary during the process because of changes in solid surface area.

The precursors used in ALD should be thermally stable at the substrate temperature because their decomposition would destroy the surface control and accordingly the advantages of the ALD method that relies on the reaction of the precursor at the substrate surface. A slight decomposition, if slow compared to the ALD growth, can be tolerated.

The precursors should chemisorb on, or react with the surface, though the interaction between the precursor and the surface as well as the mechanism for the adsorption is different for different precursors. The molecules at the substrate surface should react aggressively with the second precursor, which may be called a reactant, to form the desired solid film. Additionally, precursors should not react with the film to cause etching, and precursors should not dissolve in the film. The ability to use highly reactive precursors in ALD contrasts with the selection of precursors for conventional CVD type reactions. The by-products in the reaction should be gaseous in order to allow their easy removal from the reaction chamber during a purge stage. Further, the by-products should not react or adsorb on the surface.

In an ALD process, the self-limiting process sequence involves sequential surface chemical reactions. ALD relies on chemistry between a reactive surface and one or more reactive molecular precursors, which are pulsed into the ALD reaction chamber separately. The metal precursor reaction at the substrate is typically followed by an inert gas pulse (or purge) to remove excess precursor and by-products from the reaction chamber prior to an input pulse of the next precursor of the fabrication sequence.

By the use of ALD processes, films can be layered in equal metered sequences that are all identical in chemical kinetics, deposition per cycle, composition, and thickness. ALD sequences generally deposit less than a full layer per cycle. Typically, a deposition or growth rate of about 0.25 to about 2.00 Å per cycle can be realized.

Advantages of ALD depositions over other depositions such as CVD include continuity at an interface avoiding poorly defined nucleating regions that are typical for thin chemical vapor deposition (<20 Å) and physical vapor deposition (<50 Å), conformality over a variety of substrate topologies due to its layer-by-layer deposition technique, use of low temperature and mildly oxidizing processes, lack of dependence on the reaction chamber, growth thickness dependent solely on the number of cycles performed, and ability to engineer multilayer laminate films with resolution of one to two monolayers. ALD processes allow for deposition control on the order of single monolayers and the ability to deposit amorphous films.

A cycle of a deposition sequence includes pulsing a first precursor material, pulsing a purging gas for the precursor, pulsing a second reactant precursor, and pulsing the reactant's purging gas, resulting in a very consistent deposition thickness that depends upon the amount of the first precursor that adsorbs onto, and saturates, the surface. This cycle may be repeated until the desired thickness is achieved in a single material dielectric layer, or may be alternated with pulsing a third precursor material, pulsing a purging gas for the third precursor, pulsing a fourth reactant precursor, and pulsing the reactant's purging gas. The resulting thin layers of different dielectric materials, frequently only a few molecular layers thick, may be known as a nanolaminate. A nanolaminate means a composite film of ultra thin layers of two or more different materials in a layered stack, where the layers are alternating layers of the different materials having a thickness on the order of a nanometer, and may be a continuous film a single monolayer thick of the material. The nanolayers are not limited to alternating single layers of each material, but may include several layers of one material alternating with a single layer of the other material, to obtain a desired ratio of the two or more materials. Such an arrangement may obtain a dielectric constant that is between the values of the two materials taken singly. The dielectric layer may be made of single layers of the two or more materials deposited individually, but is essentially a single film formed of an alloy between the individual films. This may depend upon the particular materials being used and their physical and chemical properties relative to one another. If the materials are miscible, the result may be a single dielectric layer or alloy.

In an embodiment, an ALD nanolaminate of zirconium oxide, hafnium oxide and tin oxide is formed on a substrate mounted in a reaction chamber in a repetitive sequence using precursor gases individually pulsed into the reaction chamber. An embodiment includes forming the zirconium oxide using a metal alkoxy complex precursor gas, such as what may be known as a tetrakis dialkyl amino zirconium, such as tetrakis dimethylamine, which has a chemical formula of $Zr[N(CH_3)_2]_4$, or tetrakis ethylmethylamine, which has a chemical formula of $Zr[N(CH_3)(C_2H_5)]$, or tetrakis diethylamine, which has a chemical formula of $Zr[N(C_2H_5)_2]_4$, referred as TDEAZ, or other organometallic compounds. The TDEAZ is pulsed for 5 seconds at 350° C., followed by a purge of argon gas for 5 seconds. Then oxygen is pulsed for 5 seconds followed by another argon purge of 5 seconds, resulting in a zirconium oxide layer of about 0.5 nm per cycle and a surface smoothness of better than 0.5%.

Another embodiment includes forming the $ZrO_2$ layer using ALD with the organometallic compound zirconium tertiary-butyloxide as the precursor, having a formula of $Zr(OC_4H_9)_4$, and referred to as ZTB. The deposition is preformed at 350° C. with water vapor as the preferred oxidizing reactant. The ZTB was pulsed for 10 seconds, followed by a purge of nitrogen gas for 10 seconds, and water vapor was pulsed for 60 seconds, followed by another 10 second inert gas purge, resulting in a 0.05 nm layer of zirconium oxide.

Another embodiment includes forming the $ZrO_2$ layer using ALD with zirconium tetrachloride, having a formula of $ZrCl_4$, as the precursor. The deposition is performed at 300° C. with water vapor as the preferred oxidizing reactant. A 0.5 second pulse of $ZrCl_4$ is followed by a 0.5 second purge with an inert gas, such as nitrogen, and a 0.5 second pulse of water vapor, resulting in a layer having a thickness of 0.15 nm. Another embodiment includes deposition at 200° C., resulting in a thicker layer of zirconium oxide of 0.33 nm thickness. Yet another embodiment includes using a precursor of zirconium tetraiodide at 300° C. with water vapor, resulting in 0.45 nm thickness per cycle.

An embodiment includes forming the hafnium oxide using ALD with hafnium tetrachloride as the precursor and water vapor at 350° C. The precursor, purge, and reactant times are all 0.5 seconds, resulting in a hafnium oxide layer 1.5 nm thick per cycle. Another embodiment includes hafnium nitride, $Hf(NO_3)_4$ as the precursor at 300° C. with pulse times of 0.6 seconds, resulting in 0.36 nm films.

An embodiment includes forming the tin oxide using ALD with tin tetrachloride as the precursor and water vapor at 350° C., with 0.2 second precursor and reactant pulse times, and 0.4 seconds for a nitrogen purge. The resulting film is 0.18 nm thick per cycle, with less than a 2% roughness, a dielectric constant of from 9-12, and leakage currents of only $10^{-3}$ $A/cm^2$.

Other solid or liquid precursors may be used in an appropriately designed reaction chamber (also known as a reactor) for any of the above noted metals. The use of such precursors in an ALD reaction chamber may result in lower deposition temperatures in the range of 180° C. to 400° C. or lower, and the ability to use mildly oxidizing reactant materials such as $H_2O$, $H_2O_2$, various alcohols, $N_2O$, ozone or oxygen. Purge gases may include nitrogen, helium, argon or neon. It should be noted that the use of the term reactant means a precursor material that is added to the ALD reactor to react with the previously introduced precursor material, to form a nanolayer of the product material. It should be noted that there is no difference between a precursor material and a reactant material other than the order in which they enter the reactor. The terms are used to facilitate understanding of the principles of the invention, and are not used in a limiting sense.

It should be noted that the above mentioned illustrative embodiments are not intended to be limited to a single cycle of each of the materials, but rather may have multiple layers of one material deposited prior to the other layers being deposited, in order to obtain the desired final composition. As an illustrative example, the above embodiments show the tin oxide depositing thinner layers per ALD cycle than the zirconium or hafnium oxides do at a given temperature. If a final film is desired to have 25% tin, then there may be five consecutive tin oxide cycles between each zirconium oxide and hafnium oxide cycle. Alternatively, the temperature may be changed between different cycles to change the deposition rates as discussed above.

FIG. 1 shows an embodiment of an atomic layer deposition system 100 for forming a dielectric film containing tin oxide alternating with zirconium oxide and hafnium oxide. The elements depicted permit discussion of the present invention such that those skilled in the art may practice the present invention without undue experimentation. In FIG. 1, a substrate 108 on a heating element/wafer holder 106 is located inside a reaction chamber 102 of ALD system 100. The heating element 106 is thermally coupled to substrate 108 to control the substrate temperature. A gas-distribution fixture 110 introduces precursor, reactant and purge gases to the region of the surface of substrate 108 in a uniform fashion. The gases introduced by the gas distribution fixture (sometimes referred to as a showerhead in the illustrated embodiment, although other configurations may be easily imagined), react with the substrate 108, with any excess precursor gas and reaction products removed from chamber 102 by vacuum pump 104 through a control valve 105. The system 100 may operate at any desired deposition pressure by controlling the volume of gas entering the chamber 102 as compared to the volume of gaseous reaction product and excess gases removed from the chamber 102 via control of the pumping rate of vacuum pump 104, and the valve 105. ALD systems may operate at normal atmospheric pressures, or may operate under essentially vacuum conditions, or somewhere in between. In an embodiment, one of the zirconium or hafnium oxide layers is formed at a reduced pressure of $10^{-5}$ Ton pressure with oxygen gas forming a plasma with a 100 Watt RF generator (not shown) providing the oxidation reactant. Such an arrangement results in a less contaminated final film, especially carbon contamination from excess carbon in some of the precursors discussed above, such as tetrakis diethlyamine, $Zr[N(C_2H_5)_2]_4$, or other organometallic compounds.

Each gas originates from individual gas sources 114, 118, 122, 126, 130, and 134, with a flow rate and time controlled by mass-flow controllers 116, 120, 124, 128, 132 and 136, respectively. In the present illustrative embodiment the sources 118, 122 and 126 provide the three necessary precursor materials, either by storing the precursor as a gas or by providing a location and apparatus for evaporating a solid or liquid material to form the selected precursor gas by evaporation, sublimation or entrainment in a gas stream.

Also included is a single purging gas source 114, although the invention is not so limited, and numerous different purge gases, such as nitrogen, argon, neon, hydrogen and krypton may be used, individually, in combination, simultaneously or sequentially. The purge gas source 114 is coupled to mass-flow controller 116. Two reactant material sources, 130 and 134, are connected through mass-flow controllers 132 and 136. The precursor, reactant and purge gas sources are coupled by their associated mass-flow controllers to a common gas line or conduit 112, which is coupled to the gas-distribution fixture 110 inside the reaction chamber 102. Gas conduit 112 may also be coupled to another vacuum pump, or exhaust pump, not shown, to remove excess precursor gases, purging gases, and by-product gases at the end of a purging sequence from the gas conduit 112.

Vacuum pump, or exhaust pump, 104 is coupled to chamber 102 by control valve 105, which may be a mass-flow valve, to remove excess precursor gases, purging gases, and by-product gases from reaction chamber 102 at the end of a purging sequence. For convenience, control displays, mounting apparatus, temperature sensing devices, substrate maneuvering apparatus, and necessary electrical connections as are known to those skilled in the art are not shown in FIG. 1. Though ALD system 100 is well suited for practicing the present invention, other commercially available ALD systems may also be used.

The use, construction and fundamental operation of reaction chambers for deposition of films are understood by those of ordinary skill in the art of semiconductor fabrication. The present invention may be practiced on a variety of such reaction chambers without undue experimentation. Furthermore, one of ordinary skill in the art will comprehend the necessary detection, measurement, and control techniques in the art of semiconductor fabrication upon reading the disclosure. The elements of ALD system 100 may be controlled by a computer. To focus on the use of ALD system 100 in the various embodiments of the present invention, the computer is not shown. Those skilled in the art can appreciate that the individual elements such as pressure control, temperature control, and gas flow within ALD system 100 can be under computer control.

Figure 2:
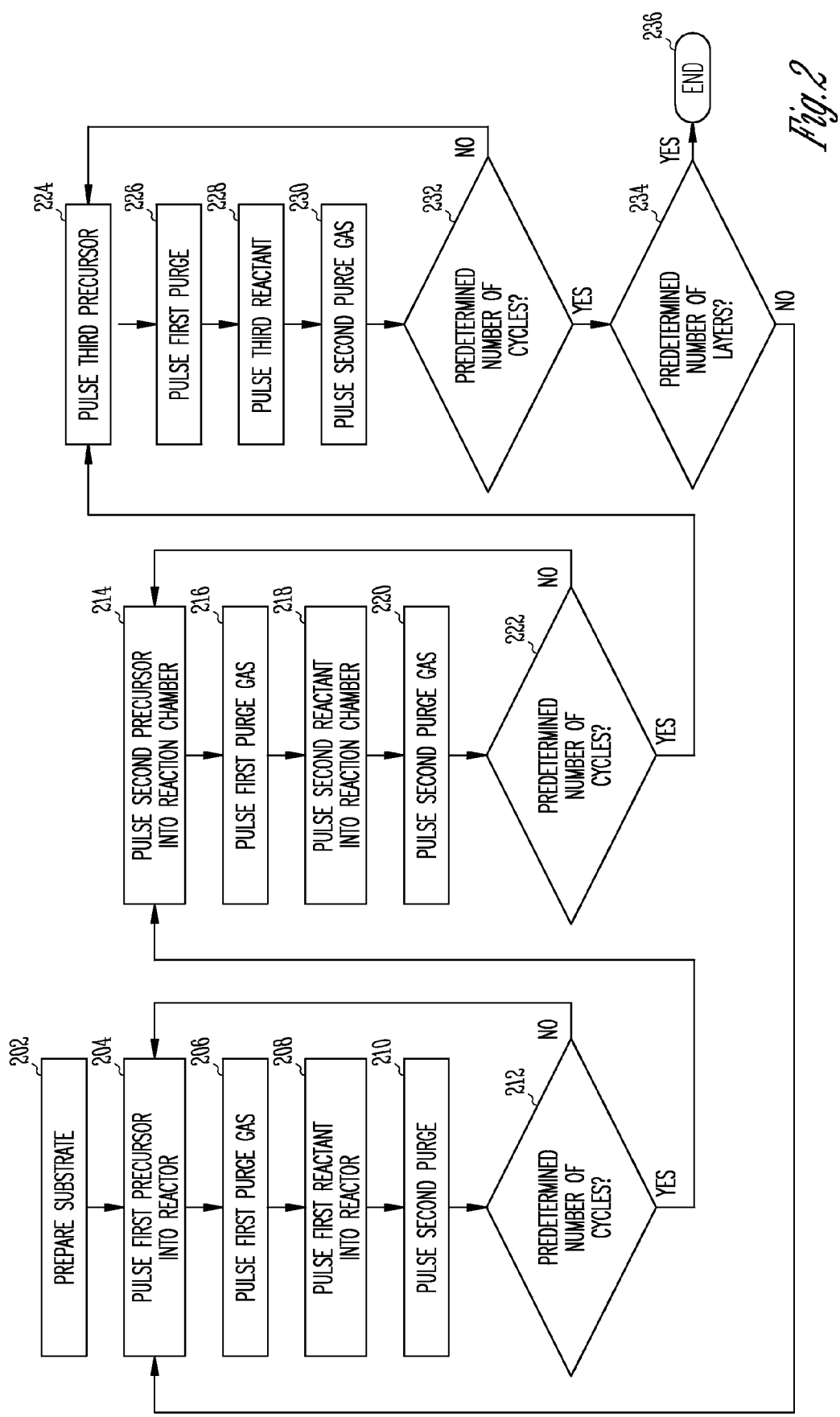
FIG. 2 illustrates a flow diagram of elements for an embodiment of a method to form a dielectric layer containing a nanolaminate layered sequence of zirconium oxide ($ZrO_2$), hafnium oxide ($HfO_2$), and tin oxide ($SnO_2$) layers by atomic layer deposition according to various embodiments of the present invention.

FIG. 2 illustrates a flow diagram of operational steps for an embodiment of a method to form a nanolaminate dielectric layer containing a zirconium oxide layer alternating with a hafnium oxide layer and with a tin oxide layer. Again note that the resulting laminate film may act as a single film having a general formula of the form $Zr_xHf_ySn_zO_2$, where Z should equal 1−X−Y, and approximately 1.0, and in an embodiment the film will have a formula of $Zr_{0.84} Hf_{0.12} Sn_{0.07} O_2$. The individual dielectric films forming the final film may be stoichiometric pure films, such as $ZrO_2$, or may be close to the stoichiometric ratio, or may be non-stoichiometric, as the final film may also have any ratio of component parts.

At 202, a substrate is prepared to react immediately with, and chemisorb the first precursor gas. This preparation will remove contaminants such as thin organic films, dirt, and native oxide from the surface of the substrate, and may include a hydrofluoric acid rinse, or sputter etch in the reaction chamber 102 of FIG. 1. At 204 a first precursor material enters the reaction chamber for a predetermined length of time, in an embodiment $Hf(NO_3)_4$, for example from 0.5-2.0 seconds, preferably 1.0 seconds. Other hafnium-containing gases, liquids and sublimating solids may also be used, as discussed previously. One advantage of the use of $Hf(NO_3)_4$ is that the final film may be free of carbon, hydrogen or halogen contamination. The first precursor material is chemically adsorbed onto the surface of the substrate, the amount depending at least in part upon the temperature of the substrate, in one embodiment 300° C., and at least in part on the presence of sufficient flow of the precursor material.

At 206 a first purge gas enters the reaction chamber for a predetermined length of time sufficient to remove substantially all of the non-chemisorbed first precursor material. Typical times may be 1.0-2.0 seconds, with a purge gas comprising nitrogen, argon, neon, hydrogen and combinations thereof.

At 208 a first reactant gas enters the chamber for a predetermined length of time, sufficient to provide enough of the reactant material to chemically combine with the amount of chemisorbed first precursor material on the surface of the substrate. In an embodiment the reactant material for the first precursor comprises water vapor (i.e., $H_2O$) for a pulse length of 0.60 seconds. Typical reactant materials include mildly oxidizing materials, including, but not limited to, water vapor, hydrogen peroxide, nitrogen oxides, ozone, oxygen gas, various plasmas of the same, and combinations thereof. At 210 a second purge gas, which may be the same or different from the first purge gas, enters the chamber for a predetermined length of time, sufficient to remove substantially all non-reacted materials and any reaction byproducts from the chamber.

At 212 a decision is made as to whether the thickness of the first dielectric material in the laminate dielectric has reached the desired thickness, or whether another deposition cycle is required. In an embodiment, the thickness of the $HfO_2$ layer obtained from a single ALD cycle is 0.33 nm. If another deposition cycle is needed to reach the desired thickness, then the operation returns to 204 and repeats the deposition process until the desired first dielectric layer is completed, at which time the process moves on to the deposition of the second material at 214.

At 214 a second precursor material for the second dielectric material enters the reaction chamber for a predetermined length of time, typically 0.5-2.0 seconds. An embodiment includes the first precursor material being diethyl amino zirconium, TDEAZ, but other zirconium containing materials, in gas, liquid or sublimating solid form, may also be used. The second precursor material is chemically adsorbed onto the surface of the substrate, in this case the top surface of the first dielectric material, the amount of absorption depending upon the temperature of the substrate, in one embodiment 300° C., and the presence of sufficient flow of the precursor material. In addition, the pulsing of the precursor may use a pulsing period that provides uniform coverage of an adsorbed monolayer on the substrate surface, or may use a pulsing period that provides partial formation of a monolayer on the substrate surface.

At 216 the first purge gas is shown as entering the chamber, but the invention is not so limited. The purge gas used in the second dielectric material deposition may be the same or different from either of the two previously noted purge gases, and FIG. 1 could be shown as having more than the one purge gas source shown. The purge cycle continues for a predetermined length of time sufficient to remove substantially all of the non-chemisorbed second precursor material.

At 218 a second reactant gas, which may the same or different from the first reactant gas, enters the chamber for a predetermined length of time, sufficient to provide enough of the reactant to chemically combine with the amount of chemisorbed second precursor material on the surface of the substrate. In an embodiment the reactant used with the TDEAZ precursor comprises water vapor with a pulse time of 2.0 seconds, resulting in a layer of $ZrO_2$ of 0.10 nm.

At 220 another purge gas enters the chamber, which may be the same or different from any of the three previously discussed purge gases, for a predetermined length of time, sufficient to remove non-reacted materials and any reaction byproducts from the chamber.

At 222 a decision is made as to whether the thickness of the second dielectric material in the laminate dielectric has reached the desired thickness, or whether another deposition cycle is required. If another deposition cycle is needed, then the operation returns to 214, until the desired second dielectric layer is completed. The desired thicknesses of the first and second dielectric materials in the nanolaminate dielectric may not be the same thickness, and there may be more deposition cycles for one dielectric material than for the other.

If the second dielectric layer has reached the desired thickness, the process moves on to 224, where a third precursor is pulsed into the reaction chamber (or reactor). In an embodiment the third precursor is a tin tetrachloride pulse lasting 0.20 seconds at 300° C. Again, the third precursor chemisorbs onto the surface, at this point the second dielectric film, $ZrO_2$.

The illustrative embodiment has a particular order of precursors, which is for illustration only; the invention is not so limited, and any of the three discussed precursors may be used in any order, in accordance with the desired film characteristics.

At 226 another purge occurs to remove non-chemisorbed portions of the third precursor, and at 228 the third reactant is pulsed into the reactor. The third reactant may be the same as the previous reactants, or the third reactant may be a different material, and in an embodiment is water vapor pulsed for 0.20 seconds. At 230 another purge occurs as before.

At 232 a decision is made as to whether the third material has reached the desired thickness, or whether another deposition cycle is required. If another deposition cycle is needed, then the operation returns to 224, until the desired second dielectric layer is completed. The desired thicknesses of the first, second and third dielectric materials in the nanolaminate dielectric may not be the same thickness, and there may be more deposition cycles for one dielectric material as compared to the other. If the third material has reached the desired thickness the operation moves to 234, where it is determined if the first, second and third dielectric materials have reached the desired number for the finished dielectric film. If more than a single layer of each dielectric material is desired, then the process moves back to another deposition of the first dielectric material at 204. After the number of interleaved layers of dielectrics one, two and three has reached the desired value, the deposition ends at 236. Although the present illustrative embodiment discusses and illustrates the layers as distinct from each other, the individual layers are very thin and may effectively act as a single alloy layer. Subsequent heat cycles may alloy the individual layers into a single dielectric layer. The present embodiment has the hafnium oxide layer deposited first, but the invention is not so limited.

The embodiments described herein provide a process for growing a dielectric film having a wide range of useful equivalent oxide thickness, $t_{eq}$, with a dielectric constant in the range from about 17 to 22. As compared to an electrically equivalent silicon dioxide thickness, an embodiment for a zirconium/hafnium/tin oxide layer may be from about four to five times thicker than an equivalent silicon dioxide thickness for reduced dielectric leakage current due to the thicker dielectric layer. Further, dielectric films formed by atomic layer deposition can provide not only equivalent thin $t_{eq}$ films, but also films with relatively low leakage current due to the improved surface smoothness. The ALD process can be implemented to form transistors, capacitors, memory devices, and other electronic systems including information handling devices. The invention is not limited to the described three dielectric materials.

Figure 3:
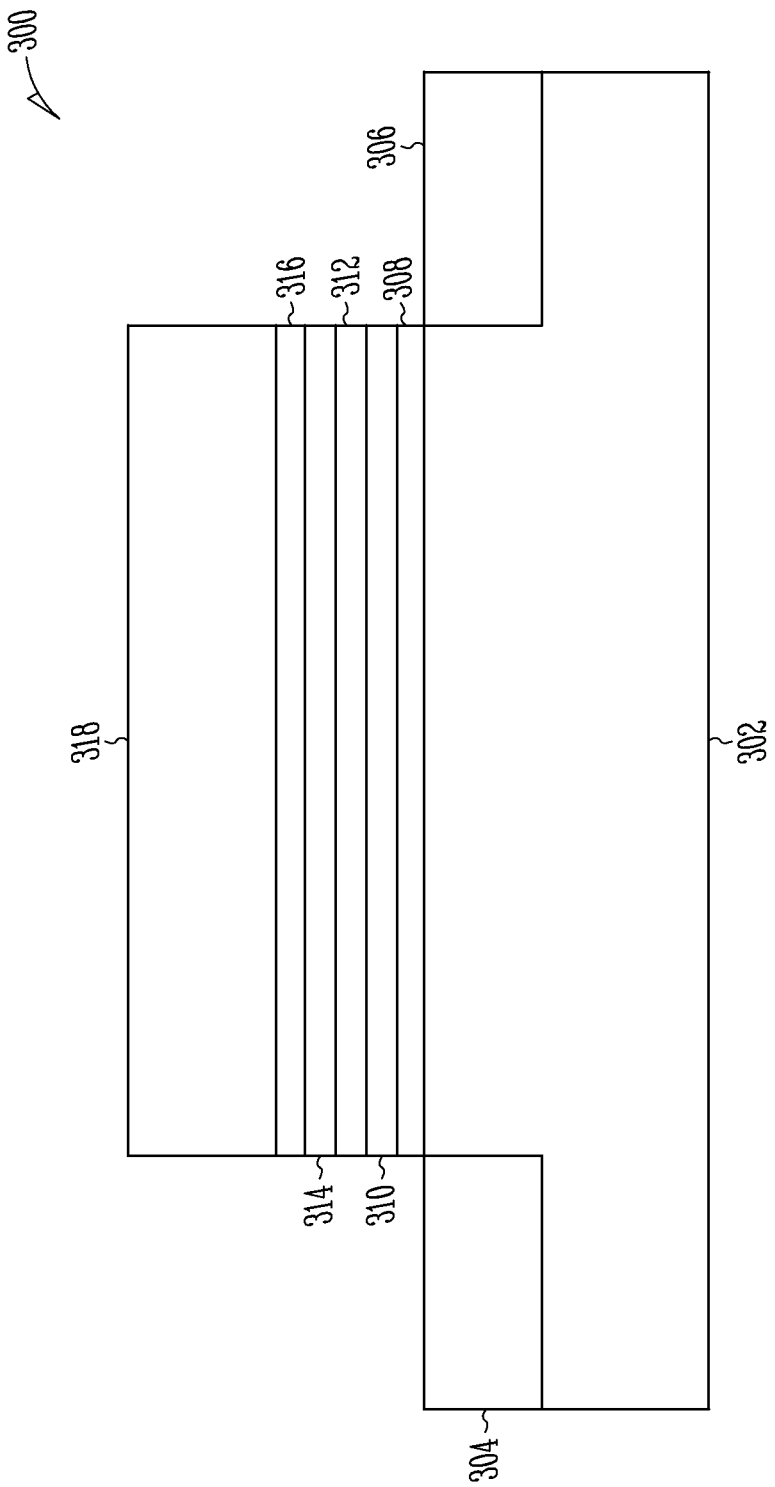
FIG. 3 illustrates an embodiment of a transistor having a dielectric layer containing an atomic layer deposited nanolaminate layered sequence of zirconium oxide ($ZrO_2$), hafnium oxide ($HfO_2$), and tin oxide ($SnO_2$) dielectric layers, according to the present invention.

FIG. 3 illustrates a single transistor in an embodiment of a method to form a dielectric layer containing an ALD deposited zirconium oxide/hafnium oxide/tin oxide gate insulator layer. A substrate 302 is prepared for deposition, typically a silicon or silicon-containing material; however, other semiconductor materials such as germanium, gallium arsenide, and silicon-on-sapphire substrates may also be used. This preparation process includes cleaning substrate 302 and forming various layers and regions of the substrate, such as drain diffusion 304 and source diffusion 306 of an illustrative metal oxide semiconductor (MOS) transistor 300, prior to forming a gate dielectric. The substrate 302 is typically cleaned to provide an initial substrate depleted of its native oxide, since the presence of a thin layer of $SiO_2$ will result in decreased capacitive coupling. The substrate may also be cleaned to provide a hydrogen-terminated surface to improve the rate of chemisorption. As an illustrative embodiment, a silicon substrate may undergo a final hydrofluoric (HF) acid rinse prior to ALD processing to provide the silicon substrate with a hydrogen-terminated surface without a native silicon oxide layer. Cleaning preceding atomic layer deposition aids in reducing the presence of silicon oxide at an interface between the silicon-based substrate and the dielectric formed using the atomic layer deposition process. The sequencing of the formation of the regions of the transistor being processed may follow typical sequencing that is generally performed in the fabrication of a MOS transistor, as is well known to those skilled in the art.

The dielectric covering the area on the substrate 302 between the source and drain diffused regions 304 and 306 is deposited by ALD in this illustrative embodiment, and comprises hafnium oxide layers 308 and 314, having interleaved zirconium oxide layers, 310 and 316, and a single tin oxide layer in the middle 312. The single shown layer of tin oxide is not intended to be a limitation, but rather to show that in the described embodiments, the amount of tin in the final dielectric layer tends toward 5-25%, and is usually less than either the zirconium or hafnium percentages.

This alloy dielectric layer may be referred to as the gate oxide. In this illustrative embodiment the hafnium oxide layer 308 is shown as being the first layer and in direct contact with the substrate 302; however, the invention is not so limited. There may be a diffusion barrier layer inserted between the first dielectric layer 308 and the substrate 302 to prevent metal contamination from affecting the electrical properties of the device. The described embodiment may also include having the first dielectric layer as zirconium oxide, since this may affect the surface states and the work function of the dielectric layer. The illustrative embodiment also shows the different dielectric layers having the same thickness, however the desired dielectric properties of the nanolaminate film may be best achieved by adjusting the ratio of the thickness of the dielectric materials to different values. Even though the illustrative embodiment shows the various oxide layers as being distinct from one another, the gate oxide (all the layers 308, 310, 312, 314, 316) in total appears as a single alloyed dielectric layer having a preferred formula of $Zr_{0.81} Hf_{0.12} Sn_{0.07} O_2$. The transistor 300 has a conductive material forming a single gate electrode 318 in this embodiment, but the gate dielectric may also be used in a floating gate device such as flash memory.

In an embodiment, gate dielectric may form a tunnel gate insulator and a floating gate dielectric in a flash memory device. Use of dielectric layers containing nanolaminate atomic layer deposited dielectric layers for a gate dielectric and/or floating gate dielectric in which the dielectric layer contacts a conductive layer is not limited to silicon based substrates, but may be used with a variety of semiconductor substrates.

Figure 4:
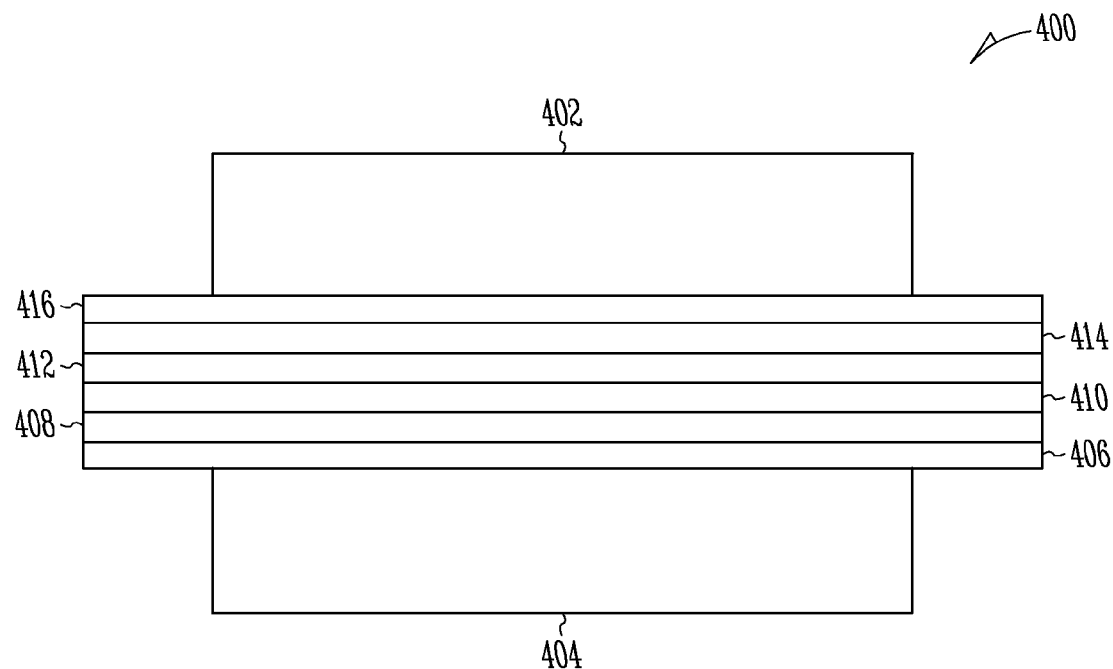
FIG. 4 shows an embodiment of a capacitor having a dielectric layer containing an atomic layer deposited nanolaminate layered sequence of zirconium oxide ($ZrO_2$), hafnium oxide ($HfO_2$), and tin oxide ($SnO_2$) layers, according to the present invention.

The embodiments of methods for forming ALD deposited dielectric layers contacting a conductive layer may also be applied to forming capacitors in various integrated circuits, memory devices, and electronic systems. In an embodiment for forming a capacitor 400 illustrated in FIG. 4, a method includes forming a first conductive layer 402, a second conductive layer 404, and a nanolaminate dielectric having interleaved layers 406, 408, 410, 412, 414 and 416 of at least three different dielectric materials, formed between the two conductive layers. The conductive layers 402, 404 may be formed of metals, doped polysilicon, silicided metals, polycides, or conductive organic compounds, without affecting the teaching of this embodiment. The sequencing of the layers may depend upon the application, or may be less important in the case of an alloyed single layer, such as the described embodiment of an effectively single dielectric layer having a formula of $Zr_{0.81} Hf_{0.12} Sn_{0.07} O_2$. An embodiment has layers 406 and 412 formed of Hafnium oxide, layers 408 and 414 formed of zirconium oxide, and layers 410 and 416 formed of tin oxide, but the invention does not require that there be an even number of layers, that the layers be deposited in any particular order, or that the order be repeated. The effective dielectric constant associated with a nanolaminate structure is attributable to N capacitors in series, where each capacitor has a thickness defined by the thickness of the corresponding layer. By selecting each thickness and the composition of each layer, a nanolaminate structure can be engineered to have a predetermined dielectric constant. Structures such as the nanolaminate structures shown in FIGS. 3 and 4 may be used in non-volatile flash memory devices as well as other integrated circuits. Transistors, capacitors, and other devices having dielectric films may be implemented into memory devices and electronic systems including information handling devices. Embodiments of these information handling devices may include wireless systems, telecommunication systems, computers and integrated circuits.

Figure 5:
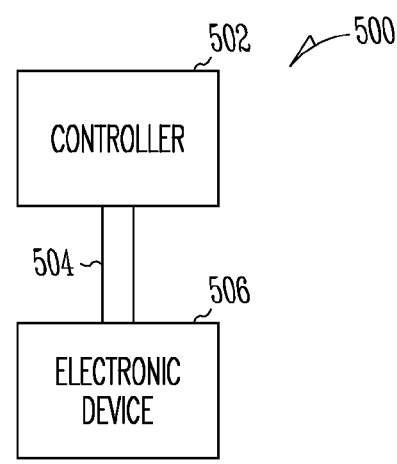
FIG. 5 is a simplified diagram for an embodiment of a controller coupled to an electronic device, according to the present invention.

FIG. 5 illustrates a diagram for an electronic system 500 having one or more devices having a dielectric layer containing an atomic layer deposited oxide layer formed according to various embodiments of the present invention. Electronic system 500 includes a controller 502, a bus 504, and an electronic device 506, where bus 504 provides electrical conductivity between controller 502 and electronic device 506. In various embodiments, controller 502 and/or electronic device 506 include an embodiment for a dielectric layer containing an ALD deposited oxide layer as previously discussed herein. Electronic system 500 may include, but is not limited to, information handling, wireless, telecommunication, fiber optic, electro-optic systems, and computers.

Figure 6:
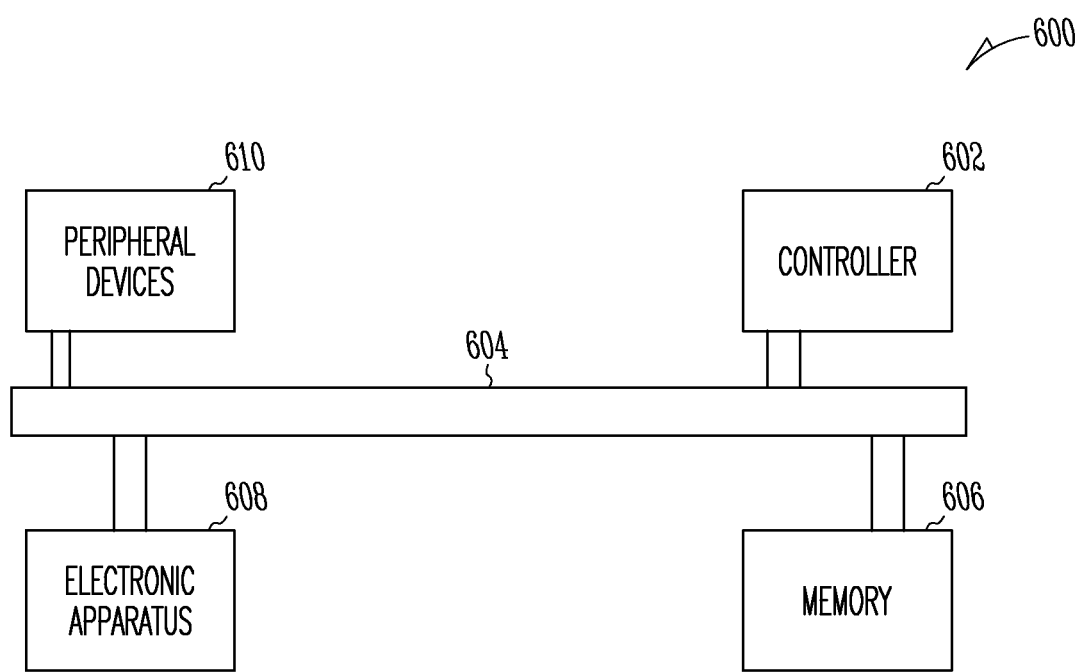
FIG. 6 illustrates a diagram for an embodiment of an electronic system having devices with a dielectric film containing an atomic layer deposited nanolaminate layered sequence of zirconium oxide ($ZrO_2$), hafnium oxide ($HfO_2$), and tin oxide ($SnO_2$) in a dielectric layer, according to the present invention.

FIG. 6 depicts a diagram of an embodiment of a system 600 having a controller 602 and a memory 606. Controller 602 and/or memory 606 may include a dielectric layer having an ALD dielectric layer. System 600 also may include an electronic apparatus 608, and a bus 604, where bus 604 may provide electrical conductivity and data transmission between controller 602 and electronic apparatus 608, and between controller 602 and memory 606. Bus 604 may include an address, a data bus, and a control bus, each independently configured. Bus 604 may also use common conductive lines for providing address, data, and/or control, the use of which may be regulated by controller 602. In an embodiment, electronic apparatus 608 may include additional memory devices configured similarly to memory 606. An embodiment may include an additional peripheral device or devices 610 coupled to bus 604. In an embodiment controller 602 is a processor. Any of controller 602, memory 606, bus 604, electronic apparatus 608, and peripheral devices 610 may include a dielectric layer having an ALD deposited oxide layer in accordance with the disclosed embodiments.

System 600 may include, but is not limited to, information handling devices, telecommunication systems, and computers. Peripheral devices 610 may include displays, additional storage memory, or other control devices that may operate in conjunction with controller 602 and/or memory 606. It will be understood that embodiments are equally applicable to any size and type of memory circuit and are not intended to be limited to a particular type of memory device. Memory types include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging DRAM technologies.

Hafnium oxide/zirconium oxide/tin oxide layers formed by ALD may be processed at relatively low temperatures, such as 300° C., and may be amorphous and possess smooth surfaces. Such oxide films may provide enhanced electrical properties as compared to those formed by physical deposition methods, such as sputtering, or typical chemical layer depositions, due to their smoother surface and reduced damage, resulting in reduced leakage current. In particular, the addition of tin oxide into other high k metal oxides improves the ability of the films to remain in an amorphous state at the relatively high processing temperatures used in transistor fabrication processes. The use of zirconium oxide increases the dielectric constant and electrical insulation properties of the final film. Hafnium oxide has been shown to prevent amorphous films from re-crystallizing during the thermal cycles encountered during semiconductor processing.

Such dielectric layers may have adjustable dielectric constants that are higher than the commonly used silicon dioxide and silicon nitride based dielectrics, and may provide a significantly thicker physical thickness than a silicon oxide layer having the same equivalent oxide thickness, where the increased thickness may reduce leakage current and reduce oxide shorts due to pinholes and other reduced thickness areas. These properties allow for application as dielectric layers in numerous electronic devices and systems.

Capacitors, transistors, higher level ICs or devices including memory devices, and electronic systems are constructed utilizing the described ALD process for forming a dielectric film having a thin equivalent oxide thickness, $t_{eq}$. Gate dielectric layers or films containing atomic layer deposited metal oxides have a dielectric constant (k) substantially higher than that of silicon dioxide, such that these dielectric films are capable of a $t_{eq}$ thinner than $SiO_2$ gate dielectrics of the same physical thickness. Alternatively, the high dielectric constant relative to silicon dioxide allows the use of a greater physical thickness of these high k dielectric materials for the same $t_{eq}$ of $SiO_2$.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present invention includes any other applications in which embodiment of the above structures and fabrication methods are used. The scope of the embodiments of the present invention should be determined with reference to the appended claims, along with the full scope of equivalents to which such claims are entitled.

What is claimed is:

1. A metal oxide semiconductor transistor; comprising:
    a semiconductor of a first doping type and a first concentration level;
    at least two diffusion regions in a substrate having a second opposite doping type, and a second higher concentration level;
    a channel region disposed between to separate the at least two diffusion regions;
    a dielectric having a first thickness disposed above the channel region and above at least a portion of the at least two diffusion regions, including at least three different metal oxide materials that include zirconium oxide, hafnium oxide and tin oxide, the materials having an overall dielectric constant of greater than 17.0, and a physical thickness of less than 20 nm; and
    a conductive gate electrode material disposed above the dielectric and above at least a portion of the at least two diffusion regions.

2. The metal oxide semiconductor transistor of claim 1, wherein the at least three different metal oxide materials include a first plurality of individual layers of a first one of the at least three different metal oxide materials, a second plurality of individual layers of a second one of the at least three different metal oxide materials, and a third plurality of individual layers of a third one of the at least three different metal oxide materials.

3. The metal oxide semiconductor transistor of claim 2, wherein at least some of the individual layers of the at least three different metal oxide materials are in direct contact on a first surface with a different one of the at least three different metal oxide materials, and in direct contact on a second surface with a remaining one of the at least three different metal oxide materials.

4. The metal oxide semiconductor transistor of claim 1, wherein the dielectric layer has an overall layer composition formula of $Zr_xHf_ySn_zO_2$.

5. The metal oxide semiconductor transistor transistor of claim 4, wherein X is between 0.70 to 0.85, Y is between 0.05 to 0.25, and Z=1−X−Y.

6. The metal oxide semiconductor transistor of claim 5, wherein X is about 0.81, Y is about 0.12, and Z is about 0.07.

7. The metal oxide semiconductor transistor of claim 4, wherein the at least three different metal oxide material individual layers are interleaved such that a local composition of the dielectric film varies between substantially pure $ZrO_2$ at a bottom portion of the dielectric film disposed near the channel region, to substantially pure $HfO_2$ at a top portion of the dielectric film disposed near the conductive gate electrode material.

8. The metal oxide semiconductor transistor of claim 1, wherein a diffusion barrier layer is disposed between a the dielectric layer and the channel region.

9. A transistor, comprising:
    a channel region separating a pair of source or drain regions;
    an amorphous dielectric over the channel region, the dielectric containing at least one atomic layer deposited dielectric, the atomic layer deposited dielectric including zirconium oxide, hafnium oxide and tin oxide in an integrated circuit; and
    a conductive gate located over the dielectric.

10. The transistor of claim 9, wherein the atomic layer deposited dielectric includes an overall layer dielectric constant of greater than 17.0.

11. The transistor of claim 9, wherein the atomic layer deposited dielectric includes a physical thickness of less than 20 nm.

12. The transistor of claim 9, wherein the dielectric layer has an overall layer composition formula of $Zr_xHf_ySn_zO_2$, and wherein X is between 0.70 to 0.85, Y is between 0.05 to 0.25, and Z=1−X−Y.

13. The transistor of claim 12, wherein X is about 0.81, Y is about 0.12, and Z is about 0.07.

14. The transistor of claim 9, further including a diffusion barrier between the amorphous dielectric and the channel region.

15. A capacitor, comprising:
a first electrode; and
a second electrode separated from the first electrode by a dielectric, wherein the dielectric includes at least three different metal oxide materials comprising zirconium oxide, hafnium oxide, and tin oxide.

16. The capacitor of claim 15, wherein the dielectric layer has an overall layer composition formula of $Zr_XHf_YSn_ZO_2$, and wherein X is between 0.70 to 0.85, Y is between 0.05 to 0.25, and Z=1−X−Y.

17. The capacitor of claim 15, wherein X is about 0.81, Y is about 0.12, and Z is about 0.07.

18. A flash memory cell, comprising:
a channel region separating a pair of source or drain regions;
a floating gate located adjacent to the channel region; and
an amorphous dielectric over the channel region, separating the floating gate from the channel region, wherein the dielectric contains at least one atomic layer deposited dielectric, the atomic layer deposited dielectric including zirconium oxide, hafnium oxide and tin oxide in an integrated circuit.

19. The flash memory cell of claim 18, wherein the atomic layer deposited dielectric includes substantially pure $ZrO_2$ at a first portion of the dielectric film disposed near the channel region, and substantially pure $HfO_2$ at a second portion of the atomic layer deposited dielectric.

20. The flash memory cell of claim 19, wherein the atomic layer deposited dielectric has an overall layer composition formula of $Zr_XHf_YSn_ZO_2$, and wherein X is between 0.70 to 0.85, Y is between 0.05 to 0.25, and Z=1−X−Y.

21. The flash memory cell of claim 20, wherein X is about 0.81, Y is about 0.12, and Z is about 0.07.

* * * * *

UNITED STATES PATENT AND TRADEMARK OFFICE
CERTIFICATE OF CORRECTION

PATENT NO. : 8,497,542 B2  
APPLICATION NO. : 13/008726  
DATED : July 30, 2013  
INVENTOR(S) : Kie Y. Ahn et al.

Page 1 of 1

It is certified that error appears in the above-identified patent and that said Letters Patent is hereby corrected as shown below:

In the Claims:

In column 18, line 31, in Claim 5, delete "transistor transistor" and insert -- transistor --, therefor.

In column 18, line 45, in Claim 8, delete "a the" and insert -- the --, therefor.

Signed and Sealed this  
Twenty-ninth Day of October, 2013

Teresa Stanek Rea  
*Deputy Director of the United States Patent and Trademark Office*